(12) United States Patent
Kim

(10) Patent No.: US 7,498,118 B2
(45) Date of Patent: Mar. 3, 2009

(54) APPARATUS FOR REMOVING LIQUID IN IMMERSION LITHOGRAPHY PROCESS AND METHOD OF IMMERSION LITHOGRAPHY

(75) Inventor: Jin Youp Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 625 days.

(21) Appl. No.: 11/118,146

(22) Filed: Apr. 28, 2005

(65) Prior Publication Data

US 2005/0243291 A1 Nov. 3, 2005

(30) Foreign Application Priority Data

Apr. 28, 2004 (KR) ...................... 10-2004-0029336

(51) Int. Cl.
*G03F 7/26* (2006.01)
(52) U.S. Cl. ...................................... 430/311
(58) Field of Classification Search ................. 430/311, 430/322
See application file for complete search history.

(56) References Cited

U.S. PATENT DOCUMENTS

| | | | |
|---|---|---|---|
| 5,121,256 A | 6/1992 | Corle et al. | |
| 5,610,683 A | 3/1997 | Takahashi | |
| 6,079,428 A | 6/2000 | Anai | |
| 6,270,576 B1 | 8/2001 | Araki et al. | |
| 6,367,490 B1 | 4/2002 | Namba | |
| 6,375,758 B1 | 4/2002 | Nakashima et al. | |
| 6,444,409 B2 | 9/2002 | Araki et al. | |
| 6,673,155 B2 | 1/2004 | Nagashima et al. | |
| 6,725,868 B2 | 4/2004 | Kamikawa et al. | |
| 6,745,783 B2 | 6/2004 | Nakatou | |
| 6,746,543 B2 | 6/2004 | Kamikawa et al. | |
| 6,749,688 B2 | 6/2004 | Tateyama et al. | |
| 6,811,618 B2 | 11/2004 | Kuroda | |
| 6,821,550 B2 | 11/2004 | Deguchi et al. | |
| 2005/0259232 A1* | 11/2005 | Streefkerk et al. | ............ 355/53 |

OTHER PUBLICATIONS

Aaron Hand; High Index Fluids Look to 2nd-Generation Immersion; Semiconductor International; Apr. 1, 2005; pp. 1-2; Reed Business Information.
Laura Peters; Photoresists Meet the 193 nm Milestone; Semiconductor International; Feb. 1, 2005; pp. 1-7; Reed Business Information.
Aaron Hand; ITRS Update Puts More Emphasis, Faith in Immersion; Semiconductor International; Jan. 1, 2005; pp. 1-2; Reed Business Information.
Stanley Wolf Ph.D. and Richard N. Tauber Ph.D.; Silicon Processing for the VLSI Era; Process Technology; 2000; pp. 490-495; vol. 1, Second Edition; Lattice Press; Sunset Beach, USA.

* cited by examiner

*Primary Examiner*—Kathleen Duda
(74) *Attorney, Agent, or Firm*—Andrew D. Fortney

(57) ABSTRACT

An apparatus for removing an immersion lithography liquid and a method of immersion lithography are disclosed, that rapidly and easily remove liquid from a wafer before development and after exposure. The apparatus includes a housing device configured to prevent the exposure chamber from being contaminated with a scattered liquid; a (rotatable) stage inside the housing device, configured to support a substrate; and (i) a motor configured to rotate the stage or (ii) a gas-spraying device or nozzle above the stage, configured to spray the substrate with an inert gas. The method generally includes coating a photoresist on a substrate; immersing the substrate in a liquid; exposing the substrate; removing the liquid from the substrate by (i) rotating the stage and/or substrate or (ii) spraying the substrate with an inert gas; and developing the photoresist.

16 Claims, 2 Drawing Sheets

APPARATUS FOR REMOVING LIQUID IN IMMERSION LITHOGRAPHY PROCESS AND METHOD OF IMMERSION LITHOGRAPHY

CROSS-REFERENCE TO RELATED APPLICATIONS

This application claims the benefit of Korean Application No. P2004-29336 filed on Apr. 28, 2004, which is hereby incorporated by reference as if fully set forth herein.

BACKGROUND OF THE INVENTION

1. Field of the Invention

The present invention relates to apparatuses configured to remove liquid in an immersion lithography process and methods of immersion lithography, and more particularly, to such apparatuses and methods that remove immersion lithography liquid from a wafer before development and after exposure.

2. Discussion of the Related Art

With the recent development in the information media such as computers, technology for manufacturing semiconductor devices has also developed rapidly. Accordingly, the semiconductor device has been researched and studied to obtain high integration, a minute pattern and a rapid operation speed. Development of a minute pattern technology such as lithography improves the integration of the semiconductor device.

Lithography is a main technology for realizing minute patterns and high integration. Photolithography is a primary technology for printing a pattern formed on a mask onto a substrate. Past lithography technology used a g-line of 436 nm and an i-line of 365 nm with a UV lamp light source. Recent lithography technology has been developed to a high level, using a short wavelength of Excimer lasers, such as KrF lasers having a wavelength of 248 nm, corresponding to a DUV (Deep Ultraviolet) region of the light spectrum, and ArF lasers having a wavelength of 193 nm, thereby realizing high resolution. Furthermore, an up-to-date technology, for example, F2 photolithography technology of using a wavelength of 157 nm, is also newly developed.

Also, new lithography technologies, for example, ion-beam lithography, electron-beam lithography and approach X-ray lithography, are in continuous development. However, the aforementioned lithography technologies tend to require high-priced equipment. In the meantime, immersion lithography technology has great attention in that it can improve pattern resolution using a related art photolithography light source and apparatus by slightly changing its structure.

In immersion lithography technology, a liquid having a refractivity above '1' is interposed between a substrate and a projection lens, whereby it is possible to improve the resolution and a depth of focus.

Appl. Phys. Lett. 44, p. 652 (1984), by D. W. Pohl, W. Denk and M. Lanz, discloses a method for improving the resolution by interposing a liquid of high refractivity between a lens and a sample. Also, U.S. Pat. No. 5,121,256 to Corle discloses a method of pattering a minute semiconductor circuit pattern by interposing an immersion lens of a solid type. Meanwhile, U.S. Pat. No. 5,610,683 to Takahashi discloses an immersion lithography apparatus having an illumination device, a device for holding a substrate, a projection system and a casing device.

The resolution, or pattern size formed by the photolithography process, is determined by following equations:

$$RESOLUTION = k_1 \frac{\lambda}{NA}$$

$$DOF = k_2 \frac{\lambda}{NA^2}$$

where '$\lambda$' is a wavelength of the light source, '$k_1$' and '$k_2$' are constants related to or associated with the process, 'NA' is a numerical aperture of the projection lens, and 'DOF' is a depth of focus.

The improvement in resolution provided by immersion lithography can be expressed by following equations:

$$RESOLUTION = k_1 \frac{(\lambda_0/n)}{NA_0}$$

$$DOF = k_2 \frac{(\lambda_0/n)}{(NA_0)^2}$$

where '$\lambda_o$' is a wavelength of the light source in the air, '$k_1$' and '$k_2$' are constants related to or associated with the process, '$NA_0$' is a numerical aperture of the projection lens, 'DOF' is a depth of focus, and 'n' is the refractivity of the immersion liquid.

By interposing the liquid having a refractivity of 'n' between the substrate and the projection lens (for example, water having a refractivity of 1.44 to light having a wavelength of 193 nm), the resolution can be increased by 1.44 times.

FIG. 1 is a flowchart of an immersion lithography process according to the related art. First, a photoresist is coated on a substrate (S10). Then, after soft-baking the photoresist, the substrate is immersed into a liquid (S11). Soft-baking removes a solvent from the photoresist, thereby increasing an adhesive strength of the photoresist.

Next, after aligning a mask above the substrate, an exposure process is performed thereon (S12). Before the performing the exposure process, it may be necessary to correct a position error of a prior layer by measuring a position error of an alignment mark. Then, the present layer is exposed to light from the laser, passed through the mask. After that, the substrate is transported to a development device or chamber, and a PEB (post exposure bake) process and development are performed (S13).

However, the related art immersion lithography process has certain disadvantages. For example, in the related art immersion lithography process, it is difficult or impossible to remove the immersion liquid remaining on the substrate before development and after exposure. Accordingly, the liquid remaining on the substrate may react with the photoresist, or may distill or evaporate during the PEB process so that spots form on a wafer, thereby causing defects during the patterning process.

In this respect, a need is felt for rapidly and easily removing the immersion liquid from the substrate.

SUMMARY OF THE INVENTION

Accordingly, the present invention is directed to apparatuses configured to remove immersion lithography liquid and methods of immersion lithography that substantially obviate one or more problems due to limitations and disadvantages of the related art.

An object of the present invention is to provide apparatuses configured to remove immersion lithography liquid, and methods of immersion lithography, that rapidly and easily remove immersion lithography liquid from a wafer before development but after completing an immersion lithography exposure process.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus configured to remove a liquid in an immersion lithography process includes a housing device configured to prevent the inside of an exposure device or chamber from being contaminated with a scattered liquid; a rotatable stage inside the housing device, configured to support a substrate; and a motor configured to rotate the stage. Furthermore, the apparatus may include at least one gas-spraying device (or nozzle) above the stage in the housing device, configured to spray the substrate with an inert gas (or direct the flow of an inert gas at the substrate).

In another aspect, an apparatus configured to remove a liquid in an immersion lithography process includes a housing device configured to prevent the inside of an exposure device or chamber from being contaminated with a scattered liquid; a stage inside the housing device, configured to support a substrate; and at least one gas-spraying device (or nozzle) above the stage in the housing device, configured to spray the substrate with an inert gas (or direct the flow of an inert gas at the substrate). The apparatus may further include at least one gas inlet provided on or near the top of the housing device, configured to introduce an inert gas into the housing device; and at least one (gas) outlet on or near the bottom of the housing device, configured to discharge the inert gas and contaminant from the housing device.

In another aspect, a method of immersion lithography includes coating a photoresist on a substrate; immersing the substrate in a liquid; exposing the substrate; removing the liquid from the substrate by rotating the substrate at high speed; and developing the photoresist. The substrate may be sprayed with an inert gas when removing the liquid from the substrate (e.g., while the substrate is rotating at high speed).

In another aspect, a method of immersion lithography includes coating a photoresist on a substrate; immersing the substrate in a liquid; exposing the substrate; removing the liquid from the substrate by spraying the substrate with an inert gas; and developing the photoresist.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle(s) of the invention. In the drawings.

DETAILED DESCRIPTION OF THE INVENTION

Reference will now be made in detail to the following preferred embodiments of the present invention, examples of which are illustrated in the accompanying drawings. Wherever possible, the same reference numbers will be used throughout the drawings to refer to the same or like parts.

Hereinafter, an apparatus and method for removing liquid from a wafer in an immersion lithography process according to the present invention will be described with reference to the accompanying drawings.

Figure 1:
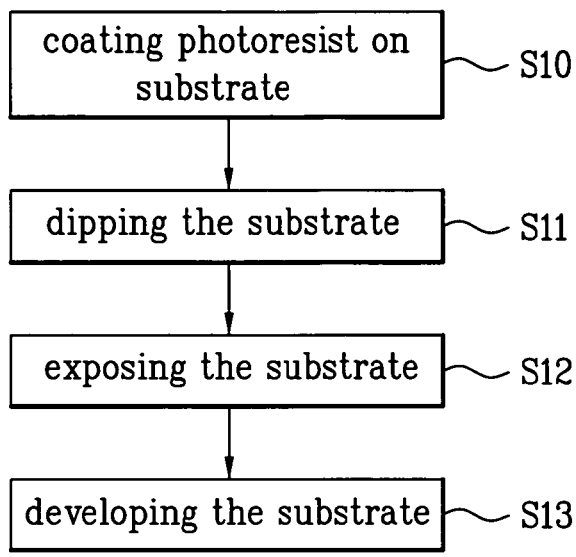
FIG. 1 is a flowchart of an immersion lithography process according to the related art.
Figure 2:
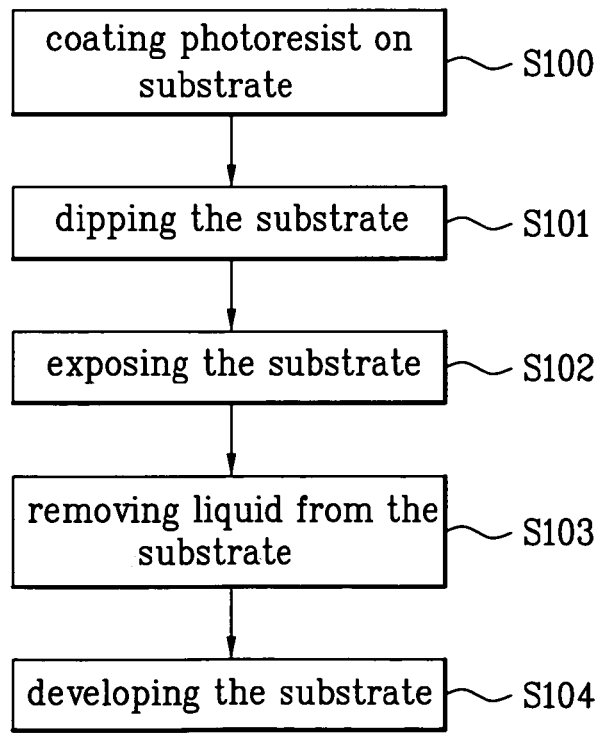
FIG. 2 is a flowchart of an immersion lithography process according to the present invention.

FIG. 2 is a flowchart of an immersion lithography process according to the present invention. First, a photoresist is coated on a substrate (S100). Then, after soft-baking the photoresist coated on the substrate, the substrate is immersed in a liquid (S101). For example, preferably, the liquid comprises or consists essentially of water (e.g., deionized and/or distilled water, which may further contain one or more salts known to increase the refractivity of water but which do not absorb significant percentages of light at the wavelength of exposure, or react with or dissolve the photoresist). However, it is not limited to water, as a great number of organic compounds are also known that have a refractivity (or refractive index) $\geq 1.4$ and that are liquid at operational temperatures for immersion photolithography. Some compounds, such as carbon disulfide, have a refractive index $\geq 1.6$. As a pattern size becomes more minute, it becomes increasingly beneficial to provide a liquid having high refractivity (e.g., sufficiently high refractivity to increase resolution and/or reduce line width in an integrated circuit and/or semiconductor device). Suitable refractivities are generally greater than 1.0, 1.2, 1.4, etc.

After that, an exposure process is performed where a mask is provided above the substrate (S102). At this time, before performing the exposure process, a position error of a prior layer is corrected by measuring a position error of an align mask, and then a present layer is exposed.

Then, the liquid remaining on the substrate is removed therefrom (S103). The liquid may be removed by rotating the substrate at high speed, spraying the substrate (e.g., directing an inert gas towards the substrate), or spraying the substrate with an inert gas while rotating the substrate at high speed. For example, the substrate may be rotated at a speed of 3000 rpm or more, whereby the liquid is rapidly removed from the substrate by a centrifugal force. Also, the inert gas may be sprayed onto the substrate, to prevent reaction with the photoresist and formation of contaminant structures (e.g., water spots) on the substrate. For example, preferably, the inert gas comprises or consists essentially of nitrogen ($N_2$). However, the inert gas is not limited to nitrogen; it may alternatively or additionally comprise or consist essentially of a noble gas, such as He, Ne, Ar, Kr and/or Xe.

Next, after the substrate is transported to a development chamber or device, a PEB (post exposure baking) process is performed on the substrate, and then exposed (irradiated) substrate is developed (S104).

Figure 3:
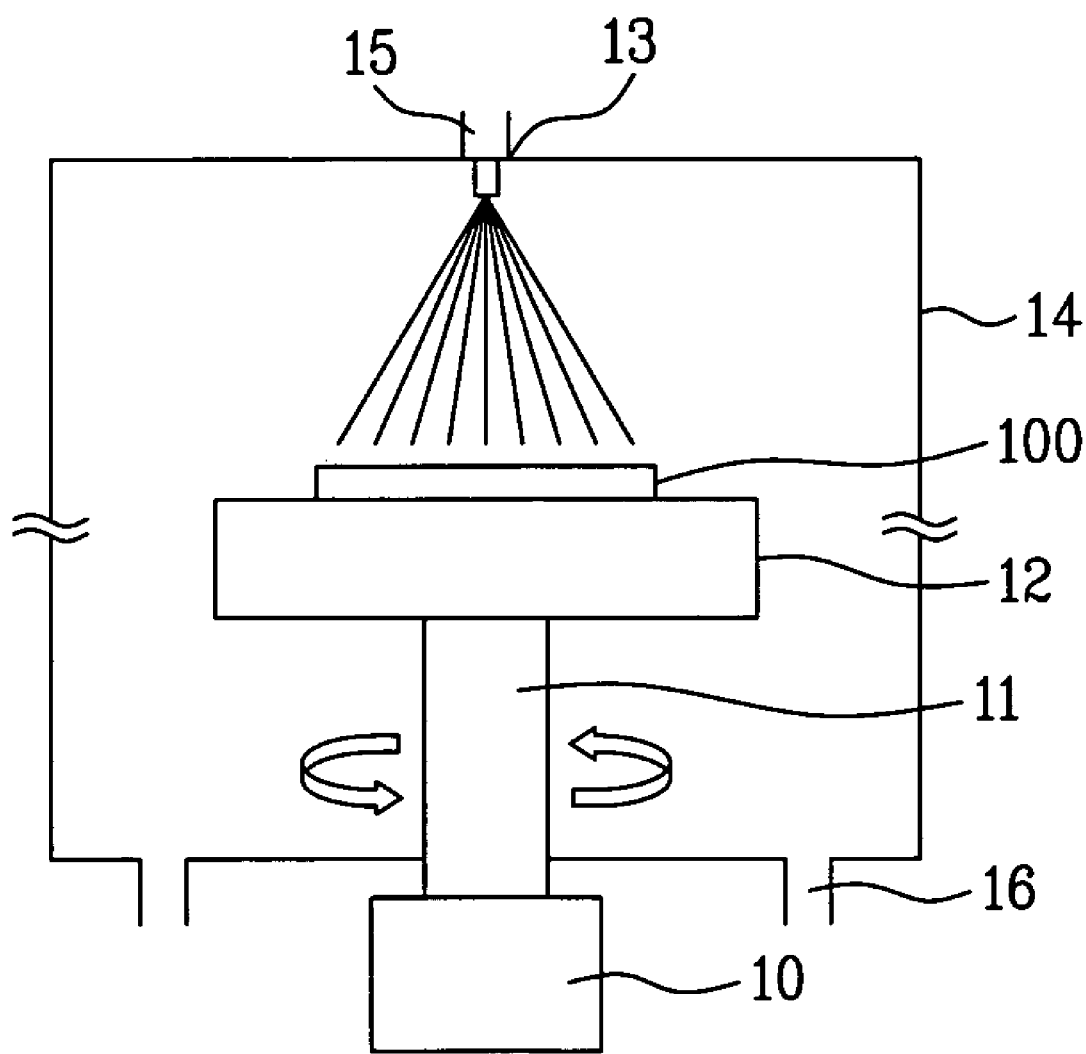
FIG. 3 is a cross sectional view of an apparatus configured to remove liquid from a substrate immersed during an immersion lithography process according to the present invention.

FIG. 3 is a cross sectional view of an apparatus configured to remove liquid in an immersion lithography process according to the present invention. That is, FIG. 3 shows the apparatus configured to remove the immersion lithography liquid from the substrate by spraying the substrate with an inert gas while substrate is rotated at high speed. In one embodiment, the liquid-removing apparatus is provided or located in an apparatus or chamber for the exposure process.

As shown in FIG. 3, the liquid-removing apparatus includes a housing device 14, a rotatable stage 12, a motor 10, a power-transmission device 11, and at least one gas-spraying device 13. As shown, the housing device 14 prevents the inside of the exposure chamber or device from being contaminated with the scattered immersion lithography liquid. Also, the stage 12 is inside the housing device 14, wherein the stage 12 supports the substrate. The motor 10 is adapted to rotate the stage 12, and the power-transmission device 11 transmits rotary power from the motor 12 to the stage 12. Also, at least one gas-spraying device 13 is provided above the stage 12 inside the housing device 14, wherein the gas-spraying device 13 sprays gas towards the substrate 12 positioned on the stage 12.

Furthermore, at least one gas inlet 15 is provided on or near the top of the housing device 14, through which the inert gas is provided. Also, at least one outlet 16 is provided on or near the bottom of the housing device 14, through which the inert gas and contaminant (e.g., comprising the immersion lithography liquid and, to the extent present, any photoresist reaction products and/or dissolved photoresist) are discharged.

Although not shown, the stage 12 may be provided with a chuck (e.g., a conventional vacuum chuck or electrostatic chuck) configured to hold or fix the substrate 100 to the stand 12. When stage 12 comprises a vacuum chuck, the chuck may have a plurality of openings connected with vacuum and/or gas flow conduits through the power-transmission device 11, whereby the substrate is fixed or held stably to the stand 12.

In FIG. 3, when the apparatus removes the immersion lithography liquid from the substrate by rotating the substrate at high speed, the gas-spraying device 13 is not required. Also, in FIG. 3, when the apparatus removes the immersion lithography liquid from the substrate by spraying the inert gas towards the substrate, the motor and the power-transmission device are not required.

Accordingly, as explained in FIG. 2, after the substrate coated with the photoresist is immersed in the immersion lithography liquid, the exposure process is performed on the substrate in the exposure chamber of the immersion lithography equipment (e.g., a stepper). Then, the substrate is conveyed or transported to the liquid-removing apparatus of FIG. 3, and positioned on the stage 12 of the apparatus. In this state, the substrate 100 is fixed to the stage 12 by the vacuum chuck, and then the motor 10 rotates the stage 12, power-transmission device 11, substrate 100 and/or chuck at high speed. Accordingly, the liquid is removed from the substrate. Alternatively, the inert gas may be sprayed onto the substrate 100 by using the gas-spraying device 13, generally at a flow rate sufficient to remove the liquid from the substrate. Also, it is possible to direct the inert gas towards the substrate 100 using the gas-spraying device 13, while the motor 10 rotate the stage 12, power-transmission device 11, substrate 100 and/or chuck at high speed, thereby removing the liquid from the substrate 100.

FIG. 3 shows an apparatus configured to remove the immersion lithography liquid from the substrate, which may be is provided or located in the photolithography exposure device or chamber. However, after exposing the substrate, the liquid may be removed from the substrate by rotating the substrate at high speed while transporting the exposed substrate to the development device or chamber, for example, on a rotating device or clamp mounted on a track. Alternatively, the inert gas may be directed towards the substrate in the development device or chamber, optionally while rotating the substrate at high speed therein, thereby removing the liquid from the substrate. At this time, an inert gas of nitrogen ($N_2$) is preferred.

As described herein, the present liquid-removing apparatus may be is provided or located in the exposure chamber of an immersion (photo)lithography tool. Thus, the invention further relates to an immersion (photo)lithography apparatus that includes an exposure device or chamber equipped with the present liquid-removing apparatus, a photoresist coating chamber or device configured to coat the substrate with photoresist, one or more cleaning chambers or devices configured to clean the substrate after or between any of the steps of the (photo)lithography process (e.g., after PEB and/or development), and/or a conveying apparatus or device (e.g., one or more tracks and/or robotic arms equipped with a wafer or wafer cassette grasping mechanism), configured to convey or transport the substrate from one chamber or device of the immersion (photo)lithography tool to another such chamber or device.

As mentioned above, the apparatuses and methods of immersion lithography according to the present invention have certain advantages. For example, it is possible to easily and rapidly remove the immersion lithography liquid from the substrate before development and after exposure in the immersion lithography process, thereby preventing certain defects that may result during formation of the pattern.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of immersion lithography comprising:
   coating a photoresist on a substrate;
   immersing the substrate in a liquid having a refractive index greater than or equal to 1.4;
   exposing the substrate;
   removing the liquid from the substrate by rotating the stage and/or substrate at high speed; and
   developing the photoresist.

2. The method of claim 1, wherein the substrate is rotated at 3000 rpm or more.

3. The method of claim 1, further comprising spraying the substrate with an inert gas when removing the liquid from the substrate.

4. The method of claim 1, wherein the step of removing the liquid from the substrate is performed in an exposure device or chamber.

5. The method of claim 1, wherein the step of removing the liquid from the substrate is performed in a development device or chamber.

6. The method of claim 1, wherein the liquid comprises one or more salts.

7. The method of claim 1, wherein the liquid comprises an organic compound.

8. The method of claim 1, wherein the liquid has a refractive index greater than or equal to 1.6.

9. A method of immersion lithography comprising:
   coating a photoresist on a substrate;
   immersing the substrate in a liquid having a refractive index greater than or equal to 1.4;
   exposing the substrate;

removing the liquid from the substrate by spraying the substrate with an inert gas; and developing the photoresist.

10. The method of claim 9, wherein the inert gas comprises nitrogen ($N_2$).

11. The method of claim 10, wherein the inert gas consists essentially of nitrogen ($N_2$).

12. The method of claim 9, wherein the step of removing the liquid from the substrate is performed in an exposure device or chamber.

13. The method of claim 9, wherein the step of removing the liquid from the substrate is performed in an development device or chamber.

14. The method of claim 9, wherein the liquid comprises one or more salts.

15. The method of claim 9, wherein the liquid comprises an organic compound.

16. The method of claim 9, wherein the liquid has a refractive index greater than or equal to 1.6.

* * * * *